(12) United States Patent
Javier et al.

(10) Patent No.: US 11,769,247 B2
(45) Date of Patent: Sep. 26, 2023

(54) EXPOSED PAD INTEGRATED CIRCUIT PACKAGE

(71) Applicant: Texas Instruments Incorporated, Dallas, TX (US)

(72) Inventors: Reynaldo Corpuz Javier, Plano, TX (US); Alok Kumar Lohia, Dallas, TX (US); Andy Quang Tran, Grand Prairie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/544,896

(22) Filed: Dec. 7, 2021

(65) Prior Publication Data
US 2022/0092767 A1 Mar. 24, 2022

Related U.S. Application Data

(62) Division of application No. 14/671,727, filed on Mar. 27, 2015, now Pat. No. 11,195,269.

(51) Int. Cl.
| | |
|---|---|
| *G06T 7/00* | (2017.01) |
| *H01L 23/495* | (2006.01) |
| *H01L 23/00* | (2006.01) |
| *H05K 3/34* | (2006.01) |

(52) U.S. Cl.
CPC ...... *G06T 7/0008* (2013.01); *H01L 23/49503* (2013.01); *H01L 23/49555* (2013.01);
(Continued)

(58) Field of Classification Search
CPC ............. G06T 7/0008; H01L 23/49503; H01L 23/49555; H01L 23/49568; H01L 24/00; H01L 2224/32245; H01L 2224/48091; H01L 2224/48247; H01L 2224/73265; H01L 22/12; H01L 24/32; H01L 24/48; H01L 24/73; H01L 2224/48464; H01L 2924/00014; H01L 2924/14;
(Continued)

(56) References Cited

U.S. PATENT DOCUMENTS 6,348,726 B1 * 2/2002 Bayan ................. H01L 23/3107
257/676
6,392,293 B2 * 5/2002 Sugihara ........... H01L 23/49582
257/692
(Continued)

FOREIGN PATENT DOCUMENTS

JP 2013161903 * 8/2013

*Primary Examiner* — Ahmed N Sefer
(74) *Attorney, Agent, or Firm* — Yudong Kim; Frank D. Cimino

(57) ABSTRACT

An IC assembly including an exposed pad integrated circuit ("IC") package having a thermal pad with a top surface and a bottom surface and with at least one peripheral surface portion extending transversely of and continuous with the bottom surface. The bottom surface and the at least one peripheral surface are exposed through a layer of mold compound. Also, methods of making an exposed pad integrated circuit ("IC") package assembly. One method includes optically inspecting a solder bond bonding a thermal pad of an exposed pad IC package to a printed circuit board. Another method includes wave soldering an exposed pad of an IC package to a printed circuit board.

21 Claims, 8 Drawing Sheets

(52) U.S. Cl.
CPC ........ *H01L 23/49568* (2013.01); *H01L 24/00* (2013.01); *H01L 2224/32245* (2013.01); *H01L 2224/48091* (2013.01); *H01L 2224/48247* (2013.01); *H01L 2224/73265* (2013.01); *H05K 3/3421* (2013.01); *H05K 2201/10689* (2013.01); *H05K 2201/10969* (2013.01)

(58) Field of Classification Search
CPC ............ H01L 2924/181; H05K 3/3421; H05K 2201/10689; H05K 2201/10969
See application file for complete search history.

(56) References Cited

U.S. PATENT DOCUMENTS

| | | | |
|---|---|---|---|
| 6,998,702 B1 * | 2/2006 | Zwenger | H01L 23/3107 257/679 |
| 2006/0062331 A1 | 3/2006 | Shirazi et al. | |
| 2007/0081313 A1 * | 4/2007 | Tanaka | H01L 33/62 361/767 |
| 2009/0032977 A1 * | 2/2009 | Yamaguchi | H05K 3/3426 257/E23.116 |
| 2011/0186902 A1 * | 8/2011 | Egoshi | H01L 24/97 257/E33.056 |
| 2012/0306065 A1 * | 12/2012 | Bin Mohd Arshad | H01L 21/561 257/676 |
| 2013/0009292 A1 * | 1/2013 | Kawasaki | H01L 23/3107 257/666 |
| 2014/0151883 A1 * | 6/2014 | Celaya | H01L 21/78 438/111 |
| 2014/0177764 A1 | 6/2014 | Tetzlaff | |
| 2015/0349999 A1 | 12/2015 | Kobatake et al. | |
| 2016/0295447 A1 | 10/2016 | Braun et al. | |
| 2016/0381643 A1 | 12/2016 | Arditti Ilitzky et al. | |

* cited by examiner

EXPOSED PAD INTEGRATED CIRCUIT PACKAGE

This application is a divisional of U.S. application Ser. No. 14/671,727, filed Mar. 27, 2015, the contents of which are herein incorporated by reference in its entirety.

BACKGROUND

Integrated circuit ("IC") packages are often surface mounted on printed circuit ("PC") boards or other electrical connection boards. The IC packages typically have components encased in a layer of protective mold compound. Many modern IC packages have internal components, such as IC dies, that generate significant amounts of heat. One way of dissipating heat generated by a die is to mount the die on one surface of a thermal pad that has the opposite surface exposed through the protective mold layer. This exposed surface of the thermal pad is then attached to a metal layer plated on a PC board. Heat from the die is conducted through the thermal pad and into the PC board where it dissipates.

SUMMARY

This specification discloses an IC assembly of an integrated circuit ("IC") package. The IC package includes a thermal pad having a top surface and a bottom surface and at least one peripheral surface portion extending transversely of and continuously with the bottom surface. The IC package also includes a layer of mold compound through which the bottom surface and the at least one peripheral surface are exposed.

Also disclosed are example embodiments of methods of: making an exposed pad integrated circuit ("IC") package assembly; making an electrical assembly; and inspecting a solder bond bonding a thermal pad of an exposed pad IC package to a printed circuit board.

DETAILED DESCRIPTION

Figure 1:
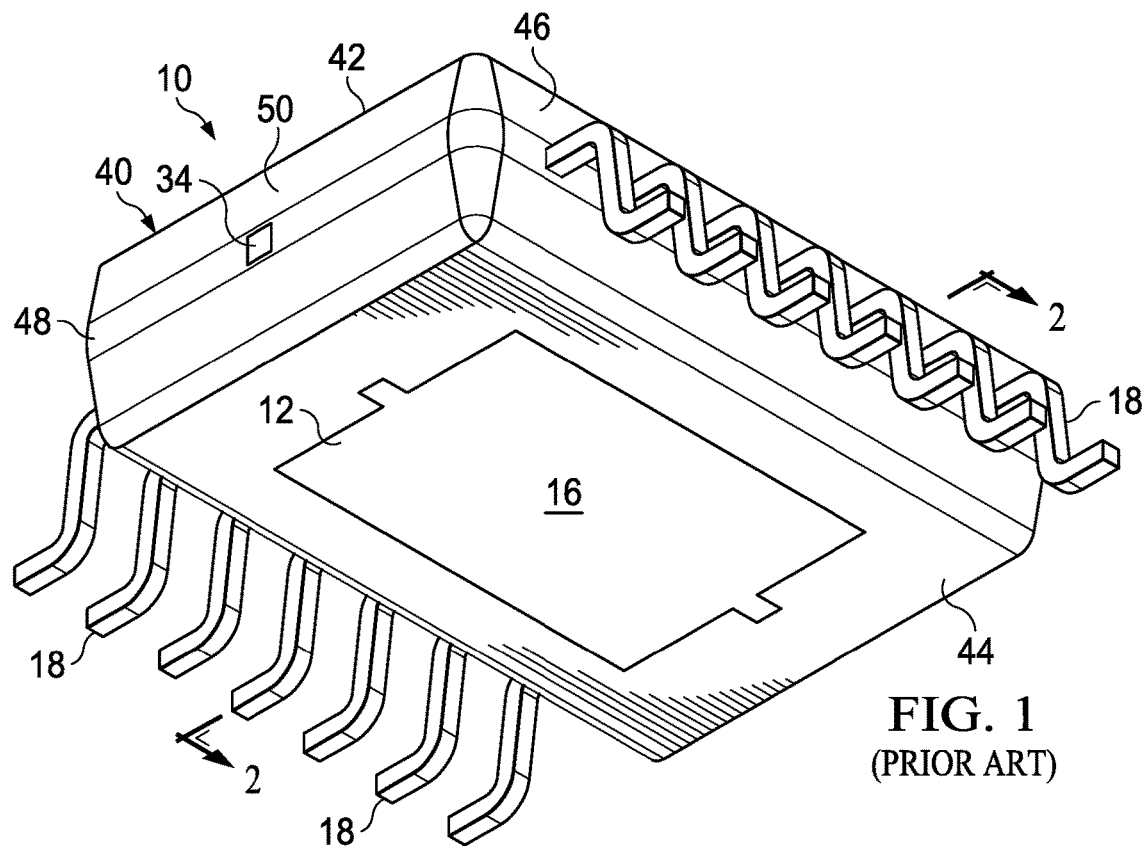
FIG. 1 is a bottom isometric view of a prior art exposed pad integrated circuit ("IC") him package.
Figure 2:
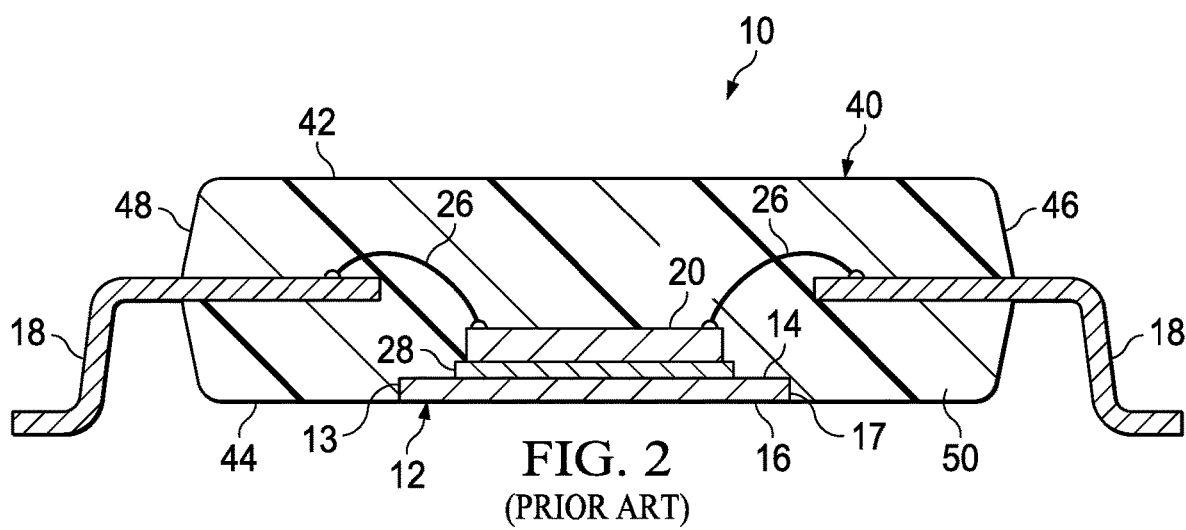
FIG. 2 is a cross-sectional elevation view of the prior art integrated circuit package of FIG. 1.
Figure 3:
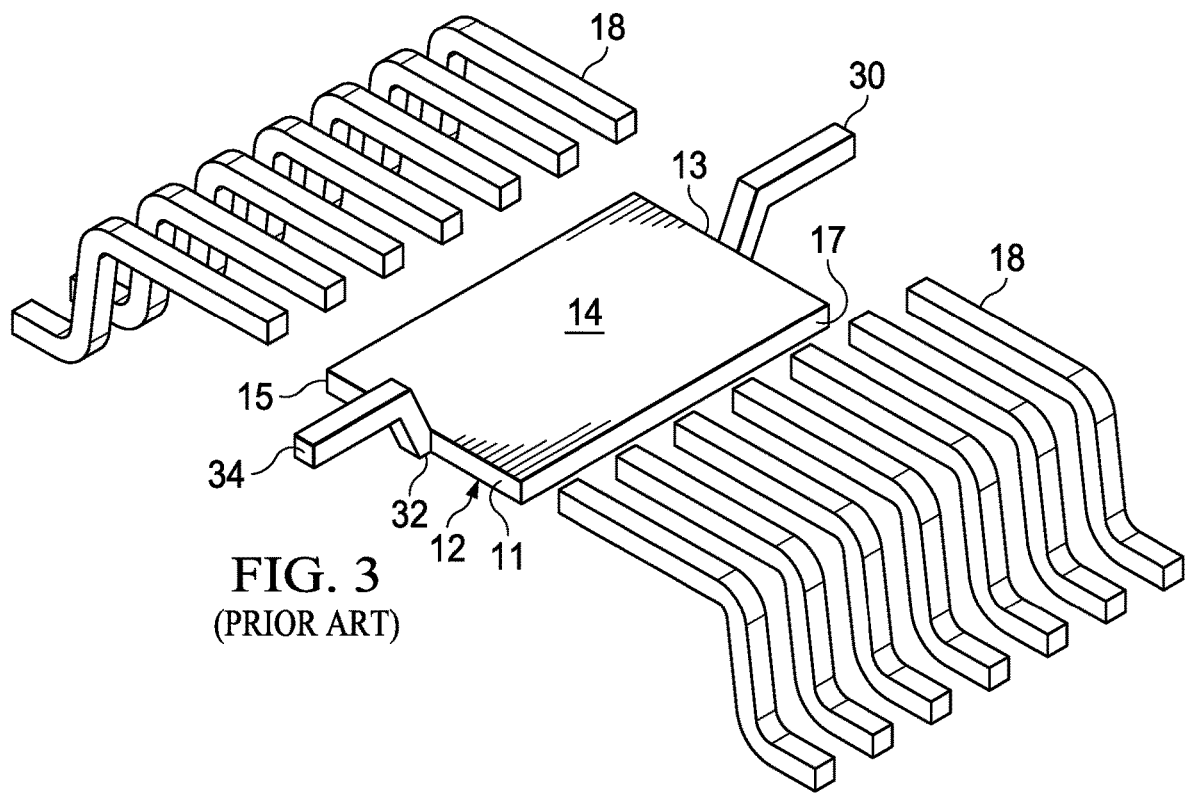
FIG. 3 is a top isometric view of the thermal pad and leads of the integrated circuit package of FIG. 1.

FIG. 1 is a bottom isometric view of a prior art exposed pad integrated circuit package 10 and FIG. 2 is a cross-sectional elevation view thereof. FIG. 3 is a top isometric view of a thermal pad 12 and leads 18 of the integrated circuit package of FIG. 1. As shown in FIGS. 1-3, the exposed pad integrated circuit package 10 has a thermal pad 12 with a top surface 14, a bottom surface 16, front and rear edges 11, 13 and lateral side edges 15, 17 A plurality of leads 18 extend outwardly from a position near the lateral sides of the thermal pad 12. A die 20 having a top surface 22 and a bottom surface 24 is bonded by a solder layer 28 to the top surface 14 of the thermal pad 12. Bond wires 26 connect proximal ends of the leads 18 to electrical contacts (not shown) on the top surface 22 of the die 20. In some embodiments the die 20 also has a contact surface on its bottom surface that is electrically connected to the thermal pad 12 by the solder layer 28.

Front and rear tie bars 30 each have proximal ends 32 attached to the thermal pad 12 and have distal ends 34, which project forwardly and rearwardly, respectively. The thermal pad 12, leads 18, and bond wires 26 are encapsulated in a block of mold compound 40. The block of mold compound 40 has a top surface 42, a bottom surface 44, lateral side surfaces 46, 48, a front surface 50, and a rear surface (not shown). A portion of each lead 18 projects laterally outwardly from a lateral side 46, 48 of the mold compound block 40. A terminal end of each distal end 34 of an associated tie bar 30 is flush with a corresponding front 50 or rear surface (not shown) of the mold compound block 40.

Figure 4:
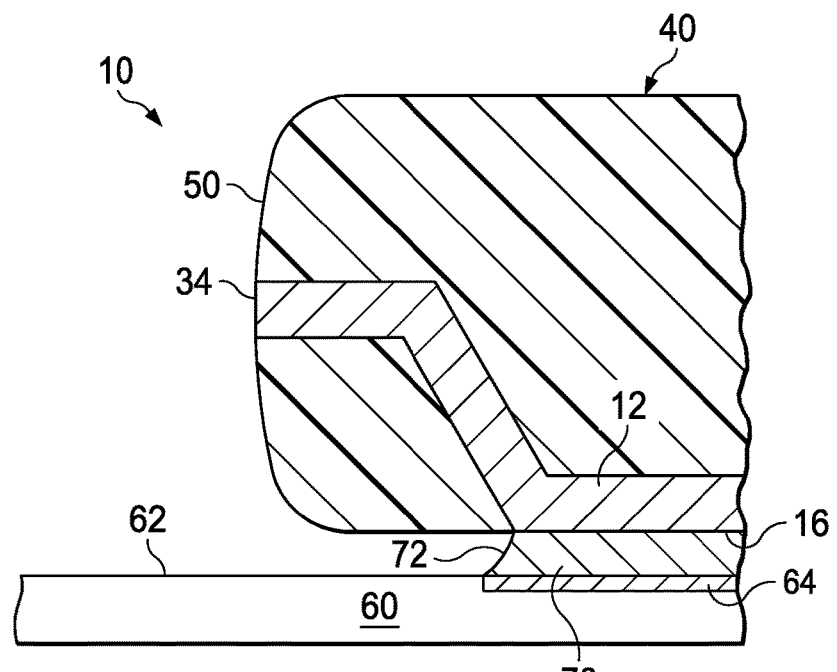
FIG. 4 is a detail cross-sectional side elevation view of the prior art integrated circuit package of FIG. 1 solder bonded to a printed circuit ("PC") board.

FIG. 4 is a detail cross-sectional side elevation view of the integrated circuit package of FIGS. 1-3 solder bonded to a printed circuit ("PC") board 60. The printed circuit board 60 has a top surface 62, which includes metal surface portions 64, etc. The bottom surface 16 of the thermal pad 12 is bonded to the metal surface portion 64 by a layer of solder 70 having a front edge 72. Because the solder layer 70 is covered by the IC package 10 it is not possible to visually inspect the solder layer 70. Thus, if the solder layer 70 is inspected at all, it is done by x-ray. X-ray inspection of solder joints is more expensive than visual inspection and is considerably less convenient.

Figure 5:
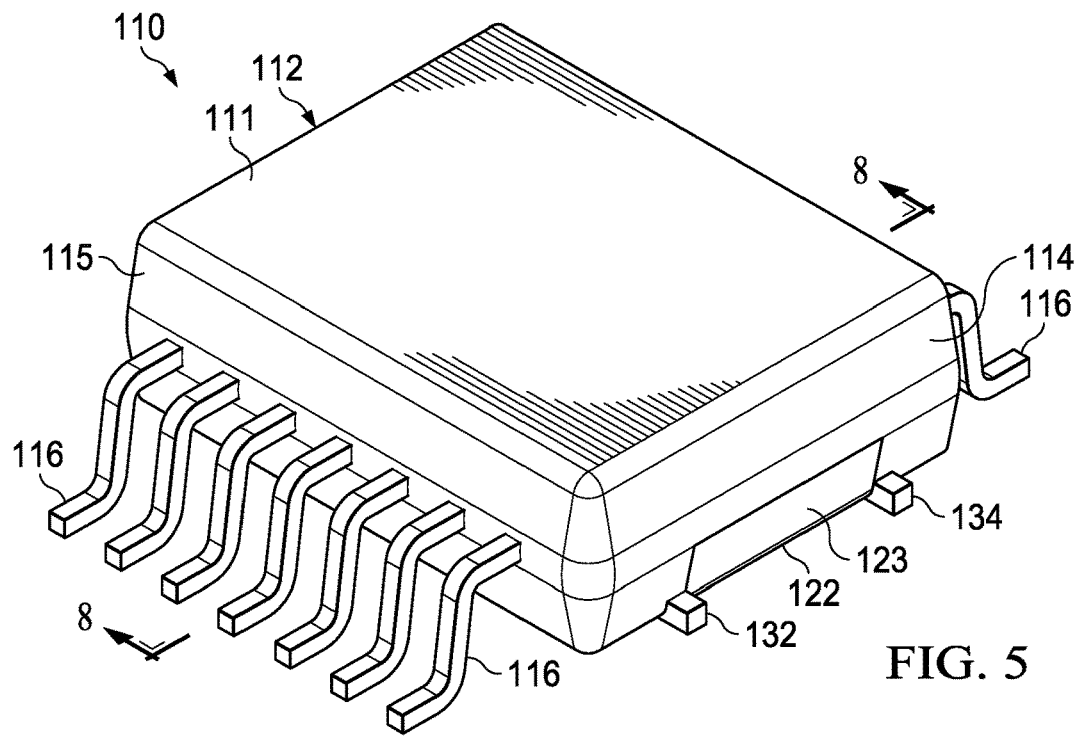
FIG. 5 is a top isometric view of one example embodiment of an exposed pad integrated circuit package.
Figure 11:
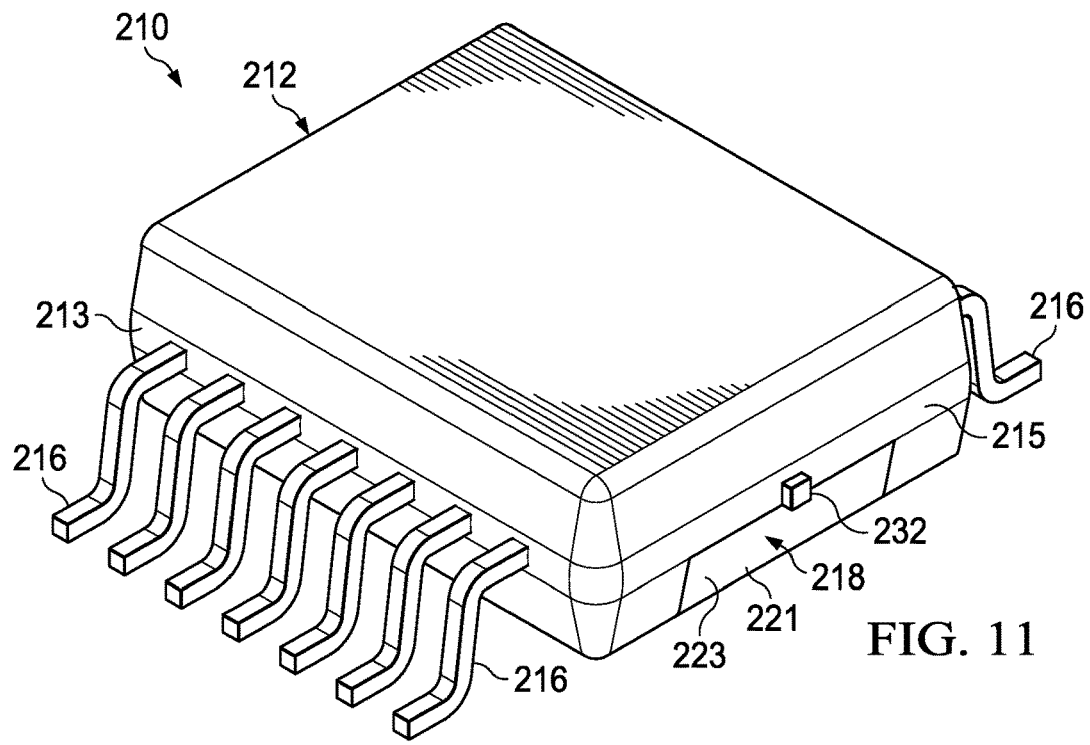
FIG. 11 is a top isometric view of another example embodiment of an exposed pad integrated circuit package.

The inventors have developed new exposed pad IC packages, e.g., packages 110 and 210 shown in FIGS. 5 and 11, which enable optical inspection of the solder bond between an IC package and associated PC board or other electrical substrate on which it is mounted.

Figure 6:
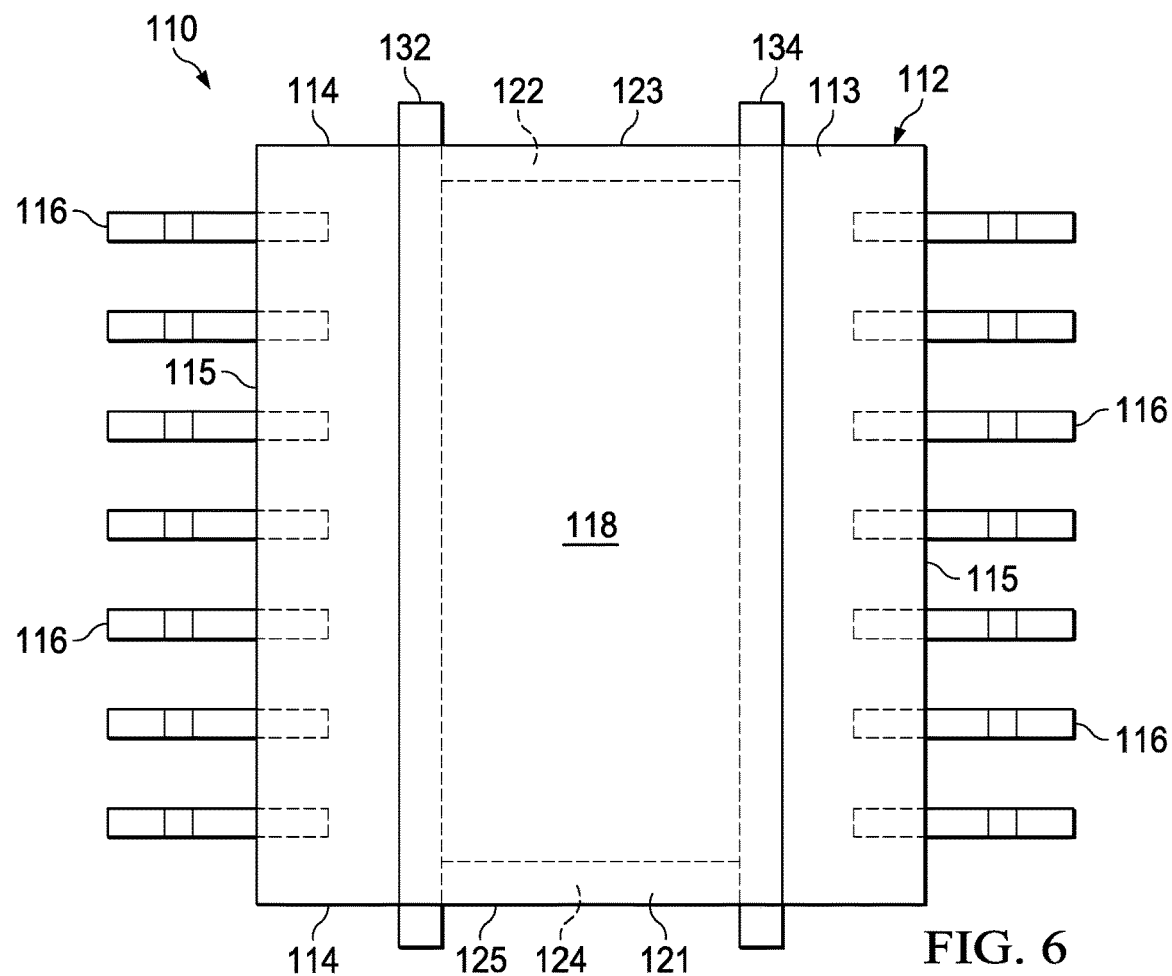
FIG. 6 is a bottom plan view of the integrated circuit package of FIG. 5.
Figure 7:
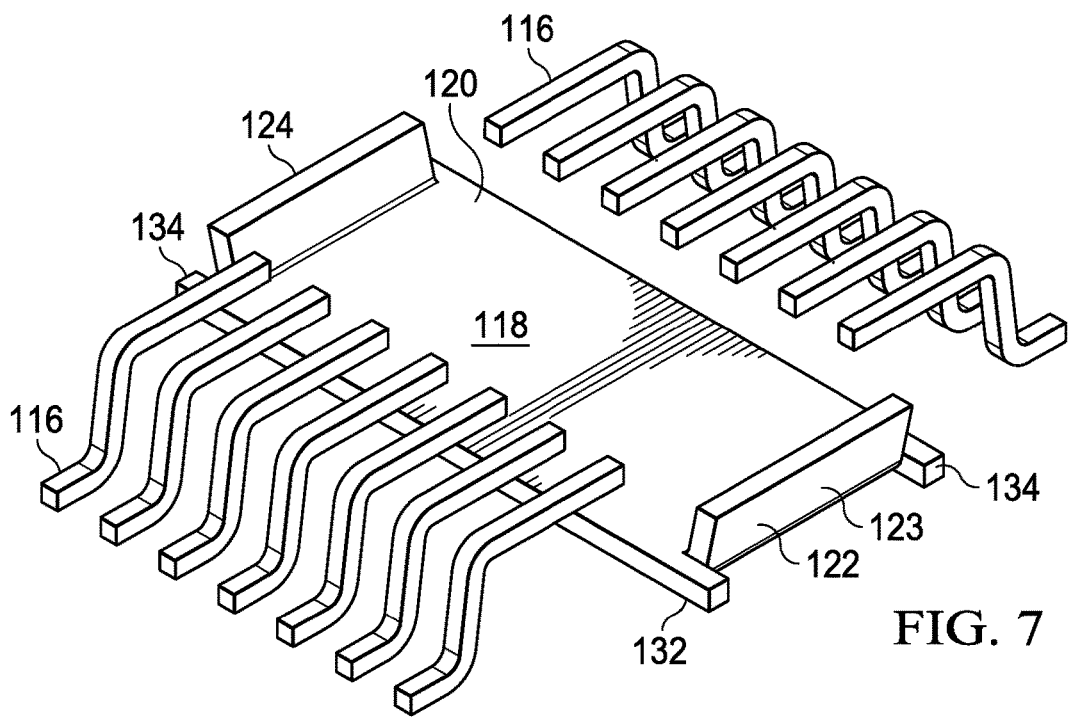
FIG. 7 is a top isometric view of the thermal pad and leads of the integrated circuit package of FIG. 5.

FIGS. 5 and 6 are top isometric and bottom plan views of an example embodiment of an exposed pad integrated circuit package 110. FIG. 7 is a top isometric view of the thermal pad and leads of the integrated circuit package 110. As shown by FIGS. 5-7, the IC package 110 is encased in a block of mold compound 112 with top and bottom surfaces 111, 113 and mirror image front and back surfaces 114 and mirror image lateral side surfaces 115 A plurality of leads 116 project laterally from the lateral sidewall surfaces 115 of the mold compound block 112. Package 110 has a thermal pad 118 with a top surface 120 and an exposed bottom surface 121. Thermal pad 118 has an upwardly extending front flange 122 with an exposed front surface 123. The thermal pad 118 may also have an upwardly extending rear flange 124 having an exposed rear surface 125, FIG. 6.

In the embodiment illustrated in FIGS. 5 and 6, tie bars 132, 134 are integrally formed with and extend along the lateral sides of the thermal pad 118. As best shown in FIG. 5, these tie bars 132, 134 may project longitudinally outwardly of the exposed surfaces of flanges 122 and 124 and thus project longitudinally outwardly from the front and rear faces of the compound block 112.

Figure 8:
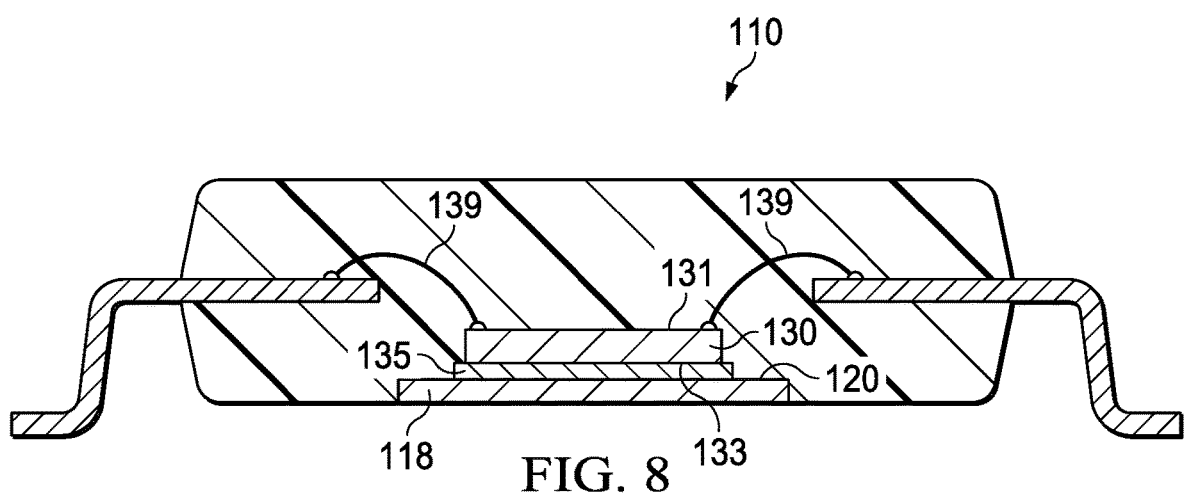
FIG. 8 is a detail cross-sectional side elevation view of the integrated circuit package of FIG. 5.

FIG. 8 is a detail cross-sectional side elevation view of the integrated circuit package 110. As shown by FIG. 8, a die 130 having a top surface 131 and a bottom surface 133 is bonded by a solder layer 135 to the top surface 120 of the thermal pad 118. Bond wires 139 connect proximal ends of the leads 116 to electrical contacts on the top surface 131 of the die 130. In some embodiments the die 130 also has a contact surface on its bottom surface that is electrically connected to the thermal pad 118 by the solder layer 135.

Figure 9:
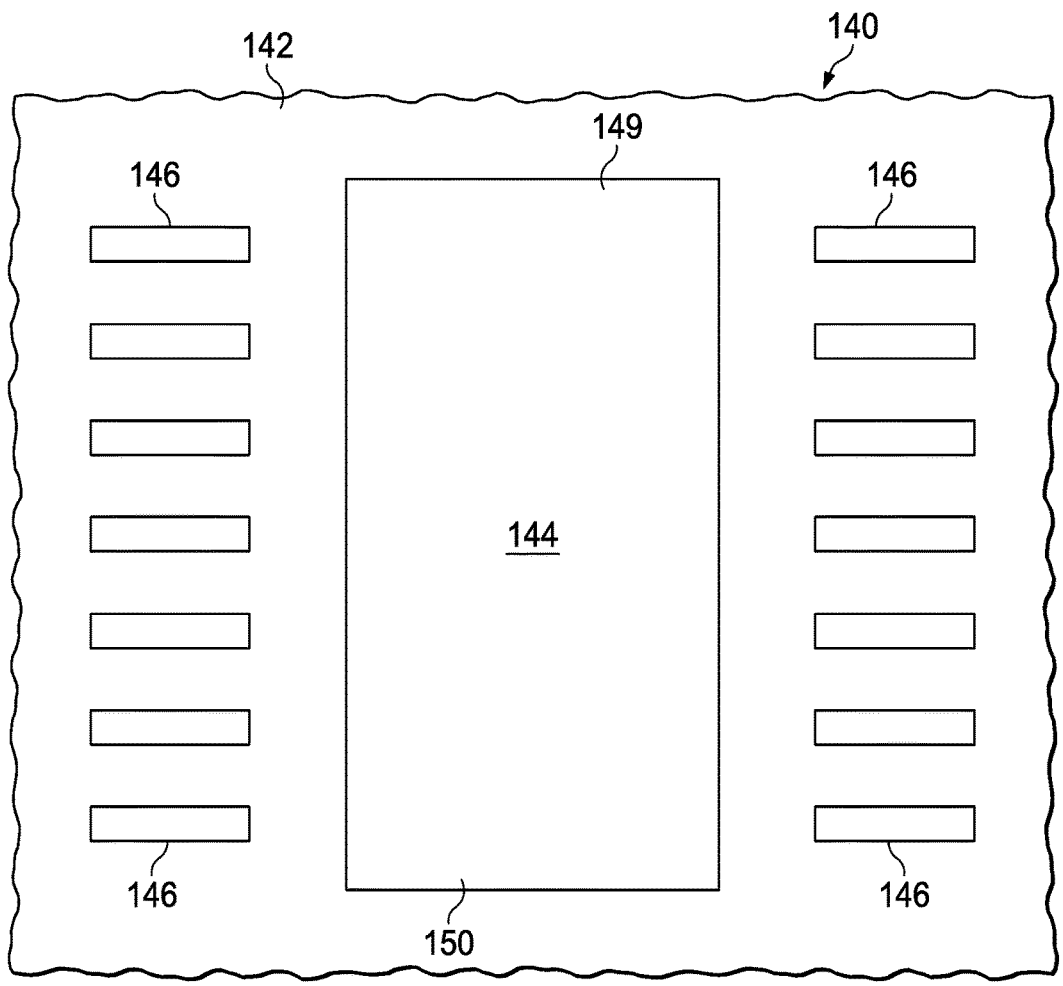
FIG. 9 is a top plan view of a PC board.

FIG. 9 is a top plan view of a PC board 140 on which the integrated circuit package 110 is mounted. A top surface 142 of the PC board 140 has a metal pattern thereon including a large central metal pad portion 144 that corresponds in length and width to the thermal pad 118 of the IC package 110. The central metal pad portion 144 is designed to be solder bonded to the thermal pad 118 of the IC package 110. The top surface 142 also has a plurality of smaller pad portions 146, which are adapted to be attached to the leads 116. The front and rear end portions 149, 150 of the central metal pad portion 144 may extend longitudinally beyond the outermost smaller pad portions 146.

Figure 10:
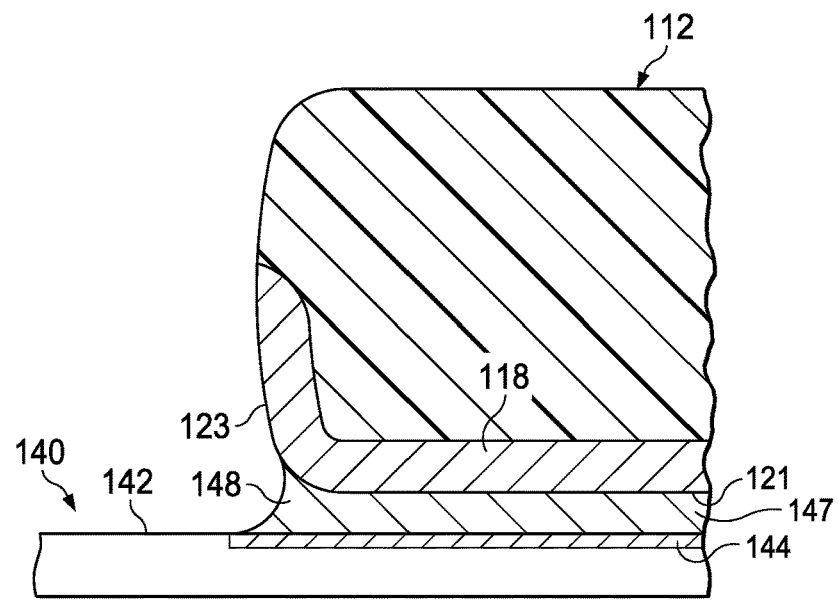
FIG. 10 is a detail cross-sectional side elevation view of the integrated circuit package of FIG. 5 solder bonded to a printed circuit board.

FIG. 10 is a detail cross-sectional side elevation view of the integrated circuit package of FIG. 5 solder bonded to the printed circuit board 140. A solder layer 147 bonds the PC board pad surface 144 to the bottom surface 121 of the thermal pad 118. A solder fillet 148 is formed at the forward end of the solder layer 147 where the solder has wicked up the front surface 123 of the front flange 122. This solder fillet 148 is not visually blocked or obscured by the IC package 110 and is thus easily optically inspected by eye or a machine vision system. The configuration at the rear portion of the PC board/IC package assembly may be identical to that of the front portion and is thus also easily optically inspected.

Figure 12:
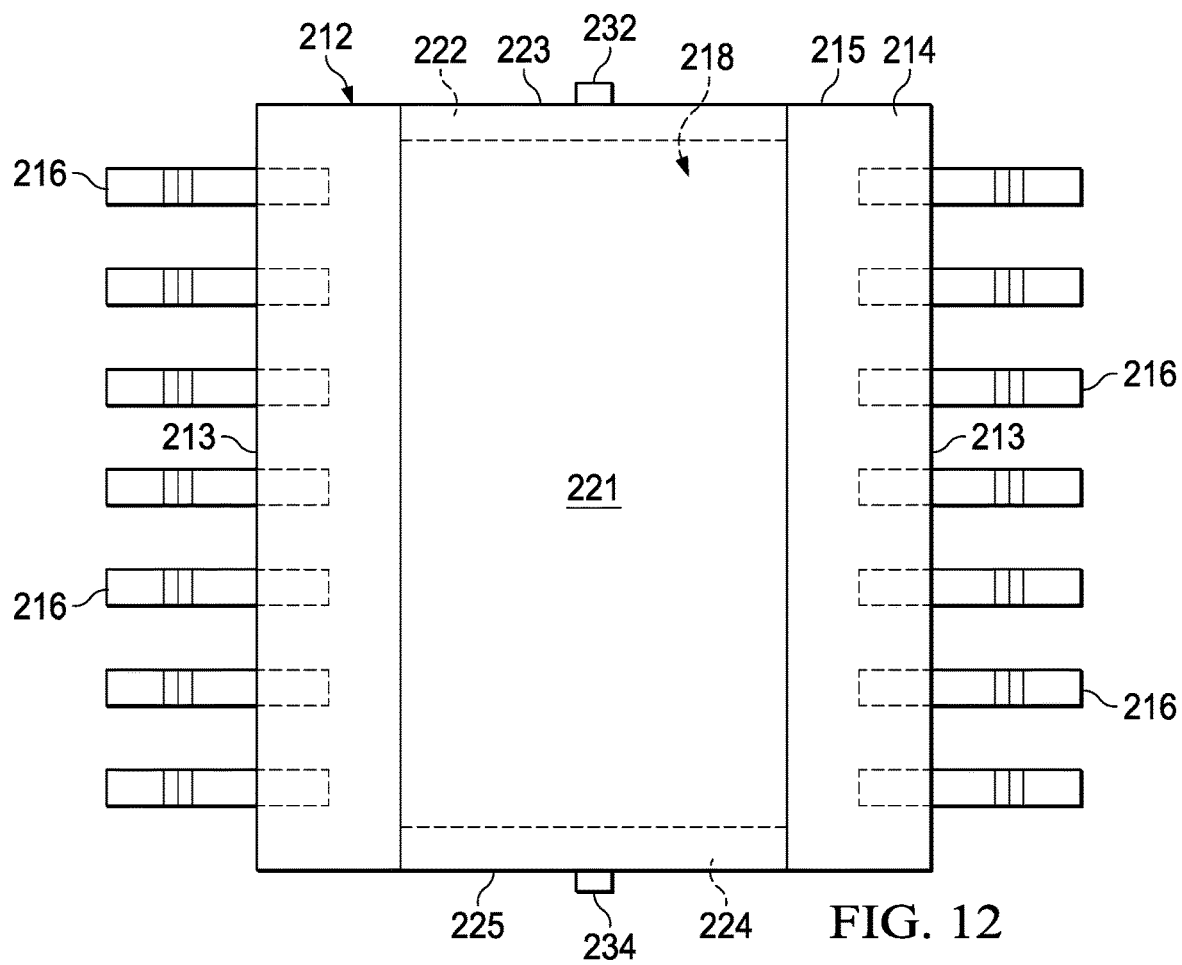
FIG. 12 is a bottom plan view of the integrated circuit package of FIG. 11.
Figure 13:
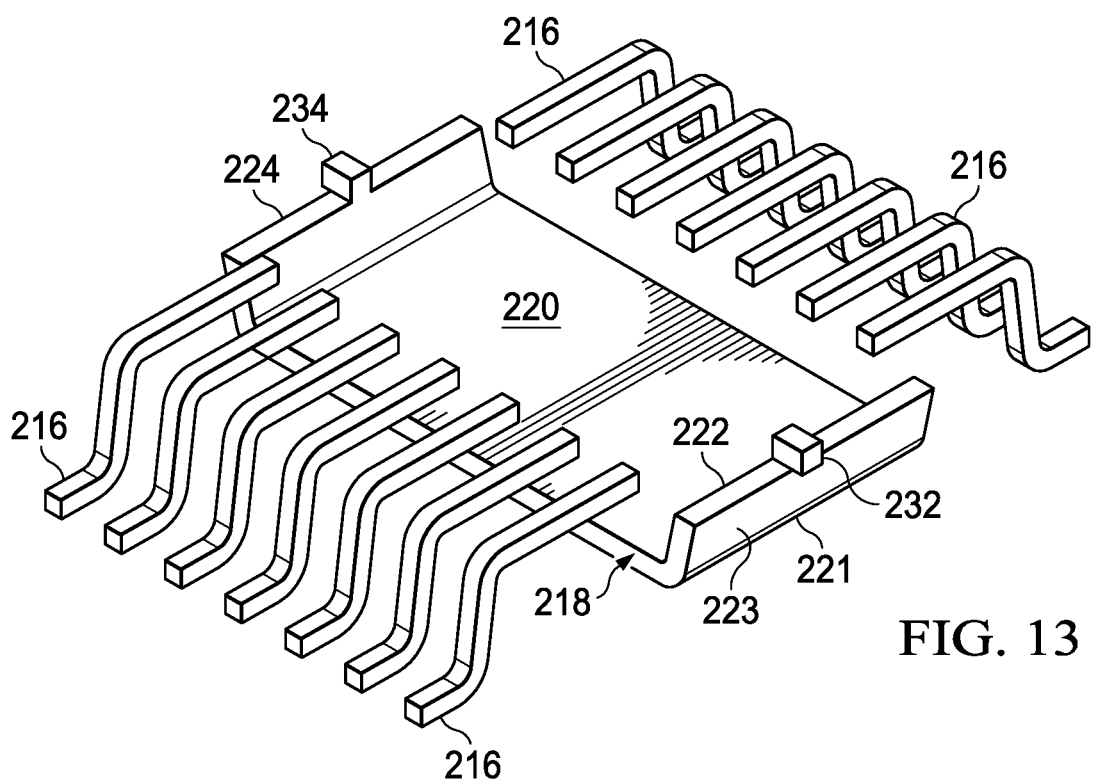
FIG. 13 is a top isometric view of the thermal pad and leads of the integrated circuit package of FIG. 11.

FIGS. 11 and 12 are top isometric and bottom plan views of an exposed pad integrated circuit package 210 of another embodiment. FIG. 13 is a top isometric view of the thermal pad and leads of the integrated circuit package of FIG. 5. As shown by FIGS. 11-13 the exposed pad IC package 210 comprises a mold compound block 212 having lateral surfaces 213 from which laterally extending leads 216 project.

A thermal pad 218 has a top surface 220 and a bottom surface 221. The bottom surface 221 is exposed and flush (coplanar) with a bottom surface 214 of the mold compound block 212. In other embodiments the bottom surfaces 221 and 214 are not flush. Thermal pad 218 has an upwardly extending front flange 222 having exposed front surface 223 that is flush with a front surface 215 of the mold compound block 212. An exposed rear flange 224 has a rear surface 225 that is flush with the rear surface of the mold compound block 212.

A forwardly projecting tie bar 232 is integrally formed on a top edge of the front flange 222. This tie bar may project forwardly from the front flange and thus projects outwardly with respect to the front surface 215 of the mold compound block 212, as best shown in FIG. 11. A rearwardly projecting tie bar 234 integrally formed on a top edge of rear flange 224 projects from a rear surface 225 of the mold compound block 212.

Figure 14:
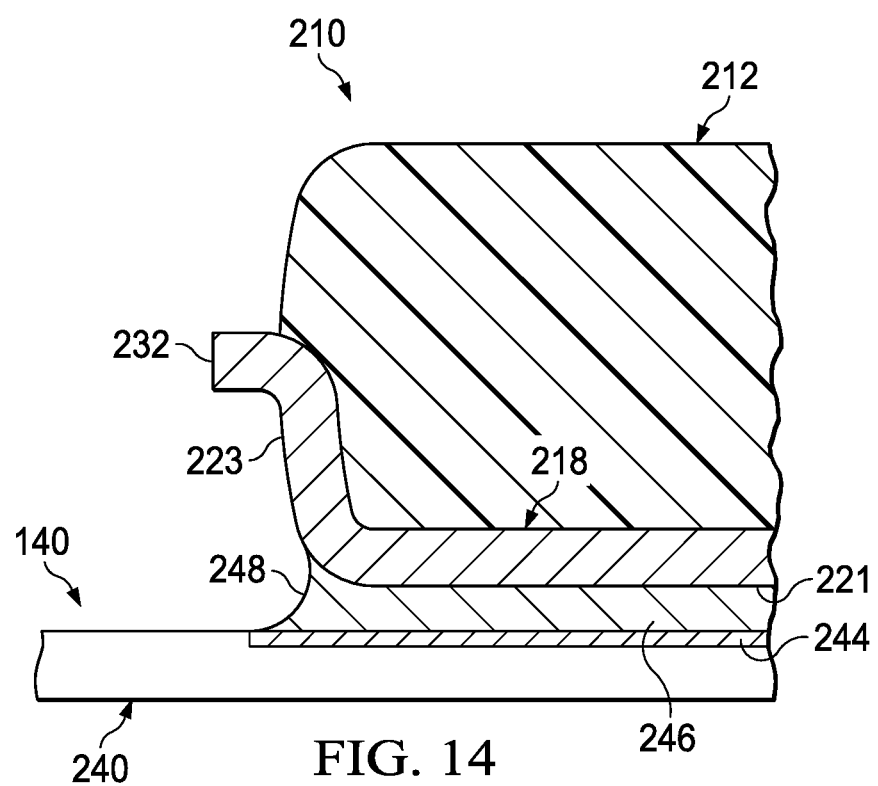
FIG. 14 is a detail cross-sectional side elevation view of the integrated circuit package of FIG. 11 solder bonded to a PC board.

FIG. 14 is a detail cross-sectional side elevation view of the integrated circuit package 210 solder bonded to the printed circuit board 240, which may be identical to PC board 140 described with reference to FIG. 9. A solder layer 246 bonds a PC board central pad surface 244 to the bottom surface 221 of the thermal pad 218. A solder fillet 248 is formed at the forward end of the solder layer 246 where the solder has wicked up the front surface 223 of the front flange 222. This solder fillet 248 is not visually blocked or obscured by the IC package 110 and is thus easily optically inspected. The configuration at the rear portion of the PC board/IC package assembly may be identical to that of the front portion and is thus also easily optically inspected.

The manner in which the exposed pad IC packages 110 and 210 are manufactured may be essentially identical to the manner in which a conventional exposed pad IC package 10 is manufactured, except for the step of creating forward and rear solder wettable metal flange surfaces 223, 225, which are exposed through the front and rear surfaces of a mold compound block 212.

The manner in which the packages 110 and 210 are solder attached to a PC board or other electrical substrate with conventional reflow soldering may be similar to the attachment process for a conventional exposed pad IC package 10. As with the prior art process the PC board has a layer of solder paste applied to the surface pattern thereof that is to be attached to the package 110 or 210. The IC package 110 or 210 is then placed with the thermal pad thereof in contact with the solder paste and the assembly is moved into a reflow oven where the solder reflows and bonds the package 110 or 210 to the PC board. A significant difference is that when attaching the new packages 110 and 210 a solder fillet forms and wets the front and/or rear edge of the thermal pad and the solder fillet is visible. With the prior art attachment method and structure there is no visible solder fillet in the solder layer that attaches the thermal pad to the PC board.

The manner in which the exposed pad packages such as 110 and 210 are solder attached to a PC board or other electrical substrate by wave soldering cannot be performed with a conventional exposed pad package. For wave soldering to work there must be an exposed thermal pad side surface portion (front and/or rear). The solder is deposited at this exposed portion and then wicks underneath the thermal pad, soldering it to the PC board. With a conventional package 10 there is no such exposed thermal pad side surface. Thus, the inventors new exposed pad package configuration makes possible wave soldering attachment of an exposed pad IC package to a PC board.

In a wave soldering operation to attach an integrated circuit package, e.g., 110, to a PC board, e.g. 140 the bottom surface 113 of the mold compound block 112 is attached to the top surface of the PC board 140 by an adhesive (not shown). The adhesive holds the integrated circuit package 110 in place on the PC board 140 as the PC board is moved through a wave soldering machine. Within the wave soldering machine (not shown), molten solder is pumped to form a standing wave in a molten solder tank. The PC board 140 moved over the solder wave, which contacts the components of the integrated circuit package 110 that are glued to the PC board. The molten solder is wicked between the metal surfaces of the leads 116 of the integrated circuit package and the metal pad surfaces 146 on the PC board 140. The solder is also wicked by capillary action between the bottom surface 121 of the thermal pad 118 of the IC package and the top metal surface of central metal pad portion 144 of the PC board, forming a solder joint therebetween.

Figure 15:
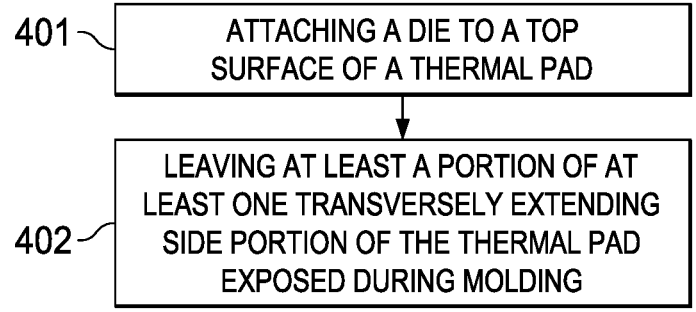
FIG. 15 is a flowchart of an example embodiment of a method of making an exposed pad integrated circuit package.

FIG. 15 illustrates a method of making an exposed pad integrated circuit package. The method includes, as shown at block 401, attaching a die to a top surface of a thermal pad and, as shown at block 402, leaving at least a portion of at least one transversely extending side portion of the thermal pad exposed during molding.

Figure 16:
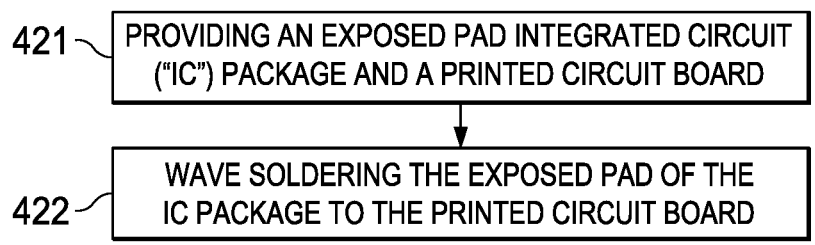
FIG. 16 is a flowchart of an example embodiment of a method of making an electrical assembly.

FIG. 16 illustrates a method of making an electrical assembly. The method includes, as shown at block 421, providing an exposed pad integrated circuit ("IC") package and a printed circuit board. The method also includes, as shown at block 422, wave soldering an exposed surface of a exposed thermal pad of the IC package to the printed circuit board.

Figure 17:
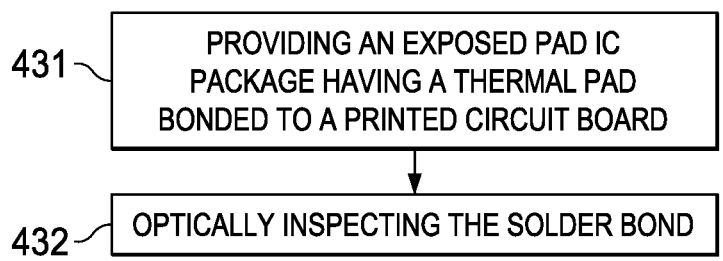
FIG. 17 is a flowchart of an example embodiment of a method of inspecting a solder bond that bonds a thermal pad of an exposed pad IC package to a printed circuit board.

FIG. 17 illustrates a method of inspecting a solder bond bonding a thermal pad of an exposed pad IC package to a printed circuit board. The method includes, as shown at block 431, providing an exposed pad IC package having a thermal pad bonded to a printed circuit board. The method also includes, as shown at block 432, optically inspecting the solder bond.

Certain embodiments of exposed pad IC packages, which make possible visual inspection of a solder layer that attaches an exposed thermal pad of the package to a an electrical substrate, have been expressly described in detail herein, along with associated methodology. Alternative embodiments of such exposed pad IC packages and associated methodology will occur to those skilled in the art after reading this disclosure. It is intended for the appended claims to be construed broadly to cover all such alternative embodiments, except as limited by the prior art.

What is claimed is:

1. An integrated circuit ("IC") assembly, comprising:
   an exposed pad IC package having:
   a thermal pad having a top surface and a bottom surface and having at least one peripheral surface portion extending transversely of and continuous with the bottom surface; and
   a layer of mold compound through which the bottom surface and the at least one peripheral surface portion are exposed, wherein:
   the at least one peripheral surface portion is flushed with a surface of the layer of mold compound; and
   the at least one peripheral surface portion corresponds to a surface of a flange that extends transversely of the top surface of the thermal pad.

2. The IC assembly of claim 1, further comprising:
   an electrical connection substrate having a top surface portion; and
   a layer of solder that bonds the bottom surface and the at least one peripheral surface portion of the thermal pad to the top surface portion of the electrical connection substrate.

3. The IC assembly of claim 2, wherein the electrical connection substrate comprises a printed circuit board.

4. The IC assembly of claim 2, wherein the layer of solder is applied by wave solder.

5. The IC assembly of claim 2, wherein the layer of solder is a layer of reflowed solder.

6. The IC assembly of claim 1, wherein the at least one peripheral surface portion extends perpendicular to the bottom surface.

7. The IC assembly of claim 1, wherein the at least one peripheral surface portion comprises at least one of a front and a rear peripheral surface portion.

8. The IC assembly of claim 7, wherein either the front peripheral surface portion or the rear peripheral surface portion of the thermal pad corresponds to the at least one peripheral surface portion.

9. The IC assembly of claim 8, further comprising:
   solder bonded to the surface of the flange, wherein the solder bonded to the surface of the flange extends upwardly from a bottom portion of the flange.

10. The IC assembly of claim 8, wherein the at least one peripheral surface portion is connected to the bottom surface of the thermal pad by an arcuate surface portion.

11. The IC assembly of claim 8, wherein the flange extends a full width of the thermal pad.

12. The IC assembly of claim 8, wherein the flange extends a portion of the full width of the thermal pad.

13. The IC assembly of claim 1, further comprising:
   a plurality of leads extending laterally outwardly of first and second lateral side edges of the thermal pad; and
   a die attached to the top surface of the thermal pad, the die having electrical contact surfaces thereon electrically connected to the plurality of leads.

14. The IC assembly of claim 13, wherein the plurality of leads comprise outer terminal end portions having generally flat bottom surfaces.

15. The IC assembly of claim 1, wherein the bottom surface of the thermal pad is generally flat, and wherein the layer of mold compound comprises a generally flat bottom surface that is generally coplanar with the generally flat bottom surface of the thermal pad.

16. An integrated circuit ("IC") assembly, comprising:
   an exposed pad IC package including:
   a thermal pad having a top surface and a bottom surface and having at least one peripheral surface portion extending transversely of and continuous with the bottom surface; and
   a layer of mold compound through which the bottom surface and the at least one peripheral surface portion are exposed, wherein
   the at least one peripheral surface portion includes at least one of a front and a rear peripheral surface portion; and
   at least one of the front and rear peripheral surface portions of the thermal pad includes at least one flange extending transversely of the top and bottom surfaces of the thermal pad, the at least one flange having an exposed surface.

17. The IC assembly of claim 16, further comprising:
   solder bonded to the exposed surface of the at least one flange, wherein the solder bonded to the at least one flange extends upwardly from a bottom portion of the at least one flange.

18. The IC assembly of claim 16, wherein the at least one flange has an exposed surface that is connected to the bottom surface of the thermal pad by an arcuate surface portion.

19. The IC assembly of claim 16, wherein the at least one flange extends a full width of the thermal pad.

20. The IC assembly of claim 16, wherein the at least one flange extends a portion of the full width of the thermal pad.

21. An integrated circuit ("IC") assembly, comprising:
an exposed pad IC package including:
a thermal pad having a top surface and a bottom surface and having at least one peripheral surface portion extending transversely of and continuous with the bottom surface;
a plurality of leads extending laterally outwardly of first and second lateral side edges of the thermal pad, wherein the plurality of leads comprise outer terminal end portions having generally flat bottom surfaces;
a die attached to the top surface of the thermal pad, the die having electrical contact surfaces thereon electrically connected to the plurality of leads; and
a layer of mold compound through which the bottom surface and the at least one peripheral surface portion are exposed.

* * * * *